US012727404B2

(12) United States Patent
Wang et al.

(10) Patent No.: US 12,727,404 B2
(45) Date of Patent: Sep. 1, 2026

(54) DEPOSITION SYSTEM AND METHOD

(71) Applicant: Taiwan Semiconductor Manufacturing Co., Ltd., Hsinchu (TW)

(72) Inventors: Chia-Hsi Wang, Hsinchu (TW); Yen-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 19/001,089

(22) Filed: Dec. 24, 2024

(65) Prior Publication Data

US 2025/0132148 A1 Apr. 24, 2025

Related U.S. Application Data

(63) Continuation of application No. 17/461,725, filed on Aug. 30, 2021, now Pat. No. 12,198,927.

(51) Int. Cl.
*H10P 14/60* (2026.01)
*C23C 14/34* (2006.01)
(Continued)

(52) U.S. Cl.
CPC ...... *H10P 14/6329* (2026.01); *C23C 14/3407* (2013.01); *C23C 14/35* (2013.01);
(Continued)

(58) Field of Classification Search
CPC ... C23C 14/3407; C23C 14/35; C23C 14/541; H01J 37/3423; H01J 37/3497;
(Continued)

(56) References Cited

U.S. PATENT DOCUMENTS 5,284,564 A * 2/1994 Maass ..................... C23C 14/35 204/192.12
5,487,822 A 1/1996 Demaray et al.
(Continued)

FOREIGN PATENT DOCUMENTS

JP H0665726 A 3/1994
JP H09143708 A 6/1997
(Continued)

OTHER PUBLICATIONS

Machine Translation JP 06-065726 (Year: 1994).
Machine Translation JP 09-143708 (Year: 1997).
Machine Translation JP 10-072667 (Year: 1998).

*Primary Examiner* — Rodney G Mcdonald
(74) *Attorney, Agent, or Firm* — Seed IP Law Group

(57) ABSTRACT

A deposition system is provided capable of extending the chamber running time by preventing the target and other components from deformation due to thermal stress from the sputtering process by maintaining the temperature within the predetermined temperature range. The deposition system includes a substrate process chamber, a target within the substrate process chamber, and a plurality of grooves formed on the target in a circular formation. The plurality of grooves includes a first groove on a center portion of the target and a second groove on a periphery portion of the target.

20 Claims, 10 Drawing Sheets

(51) Int. Cl.
*C23C 14/35* (2006.01)
*C23C 14/54* (2006.01)
*H01J 37/34* (2006.01)
*H10P 72/00* (2026.01)
*H10P 74/20* (2026.01)

(52) U.S. Cl.
CPC ........ *C23C 14/541* (2013.01); *H01J 37/3423* (2013.01); *H01J 37/3497* (2013.01); *H10P 72/0434* (2026.01); *H10P 72/0602* (2026.01); *H10P 74/203* (2026.01)

(58) Field of Classification Search
CPC ......... H01L 21/02266; H01L 21/67109; H01L 21/67248; H01L 22/12; H10P 14/6329
USPC ............................ 204/298.09, 298.12, 298.2
See application file for complete search history.

(56) References Cited

U.S. PATENT DOCUMENTS

| | | | |
|---|---|---|---|
| 11,011,356 | B2 | 5/2021 | West et al. |
| 2002/0100680 | A1 | 8/2002 | Yamamoto et al. |
| 2009/0090620 | A1 | 4/2009 | Pavloff |

FOREIGN PATENT DOCUMENTS

| | | | |
|---|---|---|---|
| JP | H1072667 | A | 3/1998 |
| TW | 200732491 | A | 9/2007 |
| TW | I368663 | B | 7/2012 |

* cited by examiner

DEPOSITION SYSTEM AND METHOD

PRIORITY CLAIM

This application is a Continuation of U.S. Non-Provisional application Ser. No. 17/461,725, filed on Aug. 30, 2021, which is incorporated by reference in its entirety herein.

BACKGROUND

To produce semiconductor devices, a semiconductor substrate, such as a silicon wafer, which is a raw material for the semiconductor devices, must go through a sequence of complicated and precise process steps such as diffusion, ion implantation, chemical vapor deposition, photolithography, etch, physical vapor deposition, chemical mechanical polishing, and electrochemical plating.

The physical vapor deposition (PVD) is generally used to deposit one or more layers (e.g., thin film) on the semiconductor substrate. For example, sputtering, a form of the PVD, is commonly used in the semiconductor fabrication process to deposit complex alloys and metals, such as silver, copper, brass, titanium, titanium nitride, silicon, silicon nitride, and carbon nitride, on the substrate. The sputtering includes a target (source), and a substrate (e.g., wafer) positioned in parallel to each other in a vacuum enclosure (e.g., process chamber). The target (cathode) is electrically grounded while the substrate (anode) has positive potential. Argon gas, which is relatively heavy and is a chemically inert gas, is commonly used as the sputtering ion species in the sputtering process. When the argon gas is introduced into the chamber, a plurality of collisions occurs with electrons released from the cathode. This causes the argon gas to lose its outer electrons and become positively charged argon ions. The positively charged argon ions are strongly attracted to the negative potential of the cathode target. When the positively charged argon ions strike the target surface, the momentum of the positively charged argon ions transfers to the target material to dislodge one or more atoms of the target material which eventually deposit on the substrate.

Due to the argon ion bombardment on the surface of the target, the target and other components around the target (e.g., magnet) are vulnerable to being overheated and deformed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
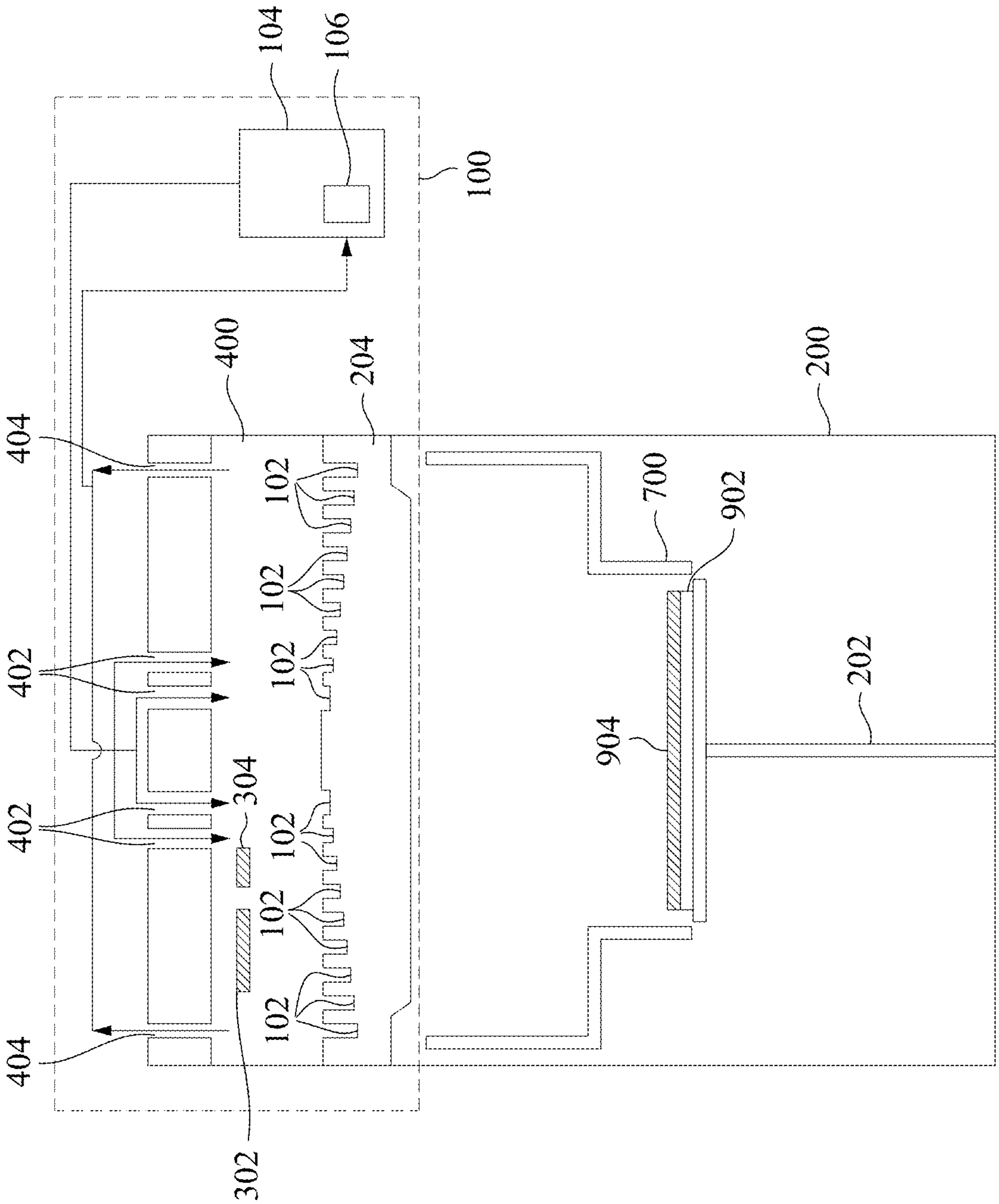
FIG. 1 is a sectional view of a substrate process chamber with a target with cooling grooves in a circular formation according to one or more embodiments in the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments in accordance with the subject matter described herein include a deposition system that is able to deposit a uniform thin film (or a layer) on a substrate (e.g., wafer) with less chamber downtime due to deformation of the target or other components (e.g., first magnet and/or second magnet) caused when the target or other components are exposed to excess amounts of thermal energy or undesired elevated temperatures. Embodiments in accordance with the subject matter described herein include an enhanced cooling system (herein after "smart cooling system"). The smart cooling system according to one or more embodiments disclosed in the present disclosure is able to release or transfer the heat (thermal energy) created from the ion bombardment during the sputtering process efficiently using cooling grooves (e.g., cooling grooves in various circular patterns, cooling grooves in various impeller shaped patterns, and/or cooling grooves in various spiral patterns) located on a top surface (or an internal surface) of the target (e.g., opposite surface of the bottom surface of the target). In various embodiments, the smart cooling system includes the cooling grooves in one or multiple patterns that are overlapped to each other on the top surface of the target (or on the internal surface of the target). In some embodiments, the cooling grooves are arranged on the top surface of the target (or the internal surface of the target) in a formation that corresponds to (e.g., overlaps with) a rotational (or orbital) pattern of a magnet which is configured to rotate (or orbit) on or above the target (e.g., first magnet rotational pattern and/or second magnet orbital pattern). In some embodiments, the cooling grooves are arranged on the top surface of the target (or the internal surface of the target) in a formation that overlaps with an actual rotational (or orbital) pattern of a magnet which is configured to rotate (or orbit) on or above the target (e.g., first magnet rotational pattern and/or second magnet orbital pattern). In some embodiments, the cooling grooves are arranged on the top surface of the target (or the internal surface of the target) in a formation that overlaps with a magnetic field pattern created by the rotational (or orbital) pattern of a magnet which is configured to rotate (or orbit) on or above the target (e.g., first magnet rotational pattern and/or second magnet orbital pattern). In some embodiments, the cooling grooves are arranged on the top surface of the target (or the internal surface of the target) in a formation that overlaps with the magnetic field pattern and the actual rotational (or orbital) pattern.

In various embodiments, the smart cooling system includes a coolant circulation system to cool the target and other components by circulating coolant or heat transfer fluid in a cooling space. In some embodiments, the cooling space is defined by the top surface of the target and an inner top portion of the chamber that encloses the cooling space where the magnets (e.g., first magnet and/or salve magnet) are configured to rotate. In some embodiments, the coolant that is being circulated by coolant circulation system is a suitable heat transfer fluid that is able to absorb the heat from the target and other components while the coolant is being circulated in the cooling space without causing damage to the chamber or components. In a non-limiting example, the coolant includes at least one of (deionized) water, glycol, ethylene glycol, propylene, or any combination thereof.

In various embodiments of the present disclosure, the smart cooling system includes one or more pumps for circulating the coolant. In some embodiments, the pump is used to supply the coolant into the cooling space. In some embodiments, the pump is used to supply the coolant into the cooling space via one or more coolant inlets. In some embodiments, multiple coolant inlets are used to accelerate the coolant circulation.

In some embodiments, the pump is used to collect the coolant from the cooling space via one or more coolant outlets. In some embodiments, multiple coolant outlets are used to accelerate the coolant circulation.

In various embodiments, the smart cooling system is able to keep the temperature of the target and other components (e.g., first magnet and/or second magnet) within a predetermined temperature range. By maintaining the temperature within the predetermined temperature range, the target and other components (e.g., first magnet and second magnet) are less likely to be deformed from thermal expansion or stress caused by the heat from the sputtering process and more likely to provide uniform deposition results (e.g., uniform deposition on the substrate).

In various embodiments, the smart cooling system extends the lifetime of the target by preventing the target from being deformed due to stresses induced by thermal expansion of the target or other components. The smart cooling system prevents the target or other components from deforming by maintaining the temperature of the target and other components within the predetermined temperature range. In various embodiments, the smart cooling system extends the chamber running time by preventing the target and other components from deforming due to stresses induced by thermal expansion of the target or other components.

FIG. 1 shows a sectional view of a substrate process chamber 200 including a target 204 with cooling grooves 102 in a circular formation, according to one or more embodiments in the present disclosure.

Figure 2:
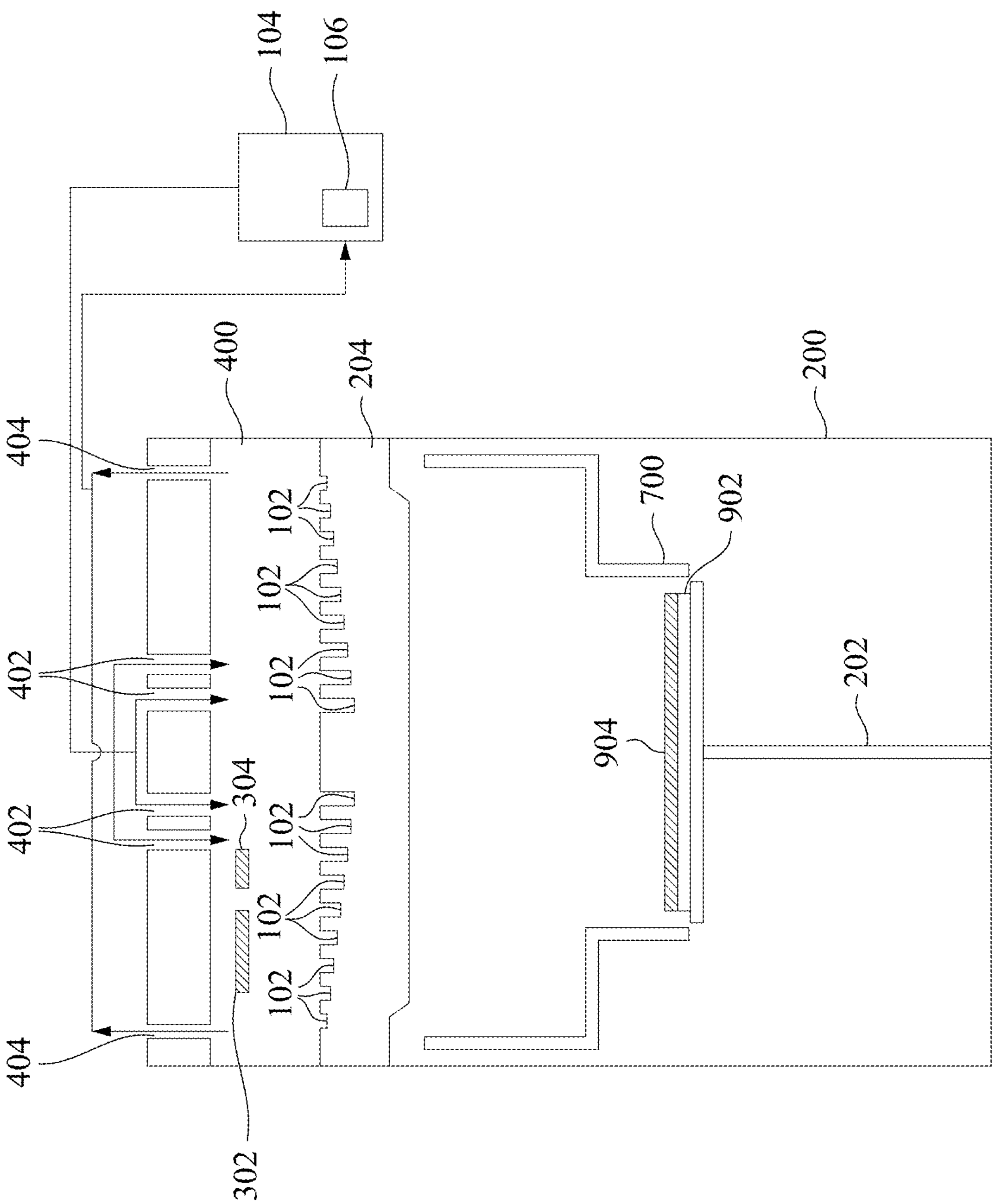
FIG. 2 is a sectional view of the substrate process chamber with a target with the cooling grooves in an alternate circular formation according to one or more embodiments in the present disclosure.

FIG. 2 shows a sectional view of the substrate process chamber 200 including a target 204 with the cooling grooves 102 in an alternate circular formation, according to one or more embodiments in the present disclosure.

Figure 3A:
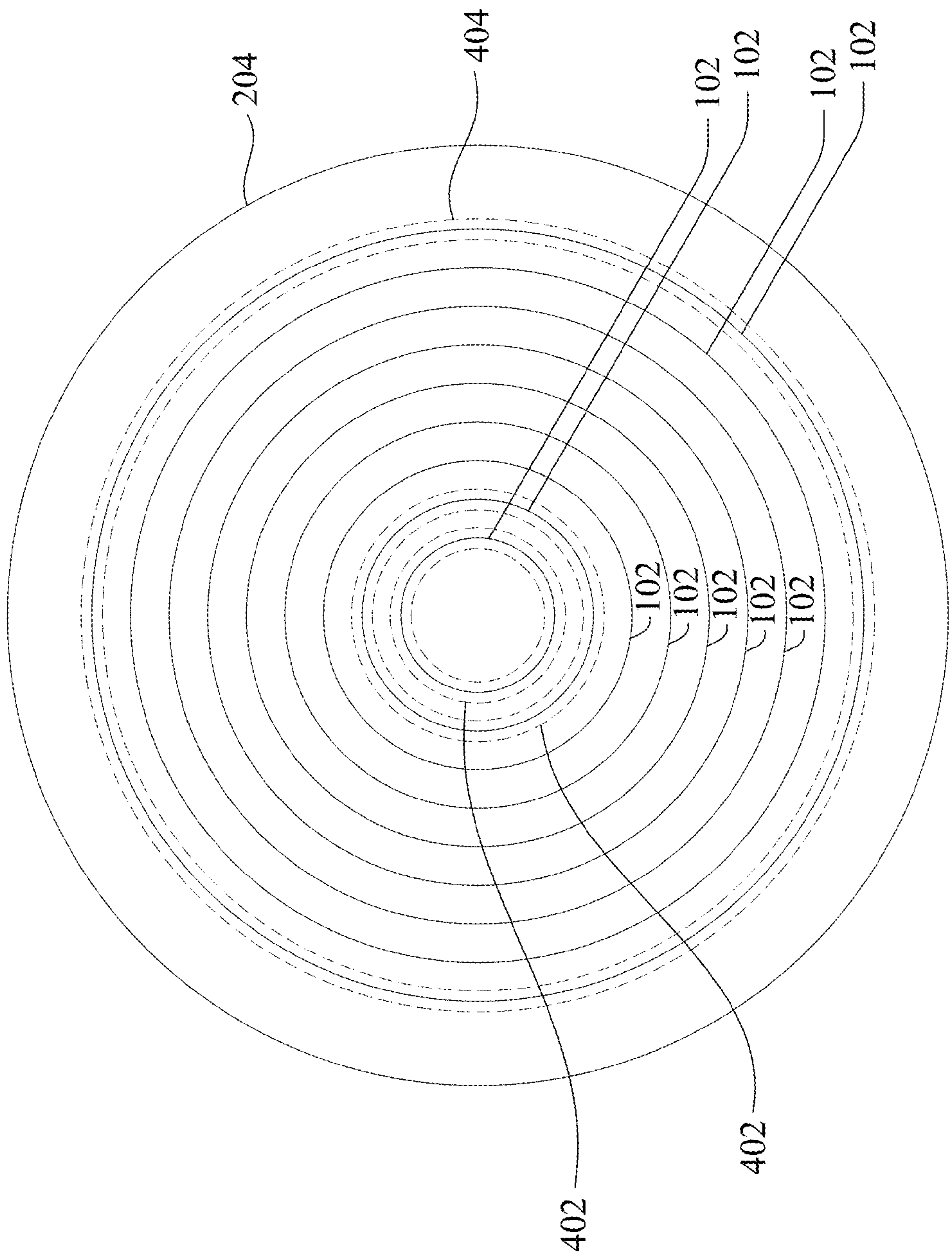
FIG. 3A is a top view of the cooling grooves in the circular formation according to one or more embodiments in the present disclosure.

FIG. 3A shows a top view of the cooling grooves 102 in the circular formation, according to one or more embodiments in the present disclosure.

Figure 3B:
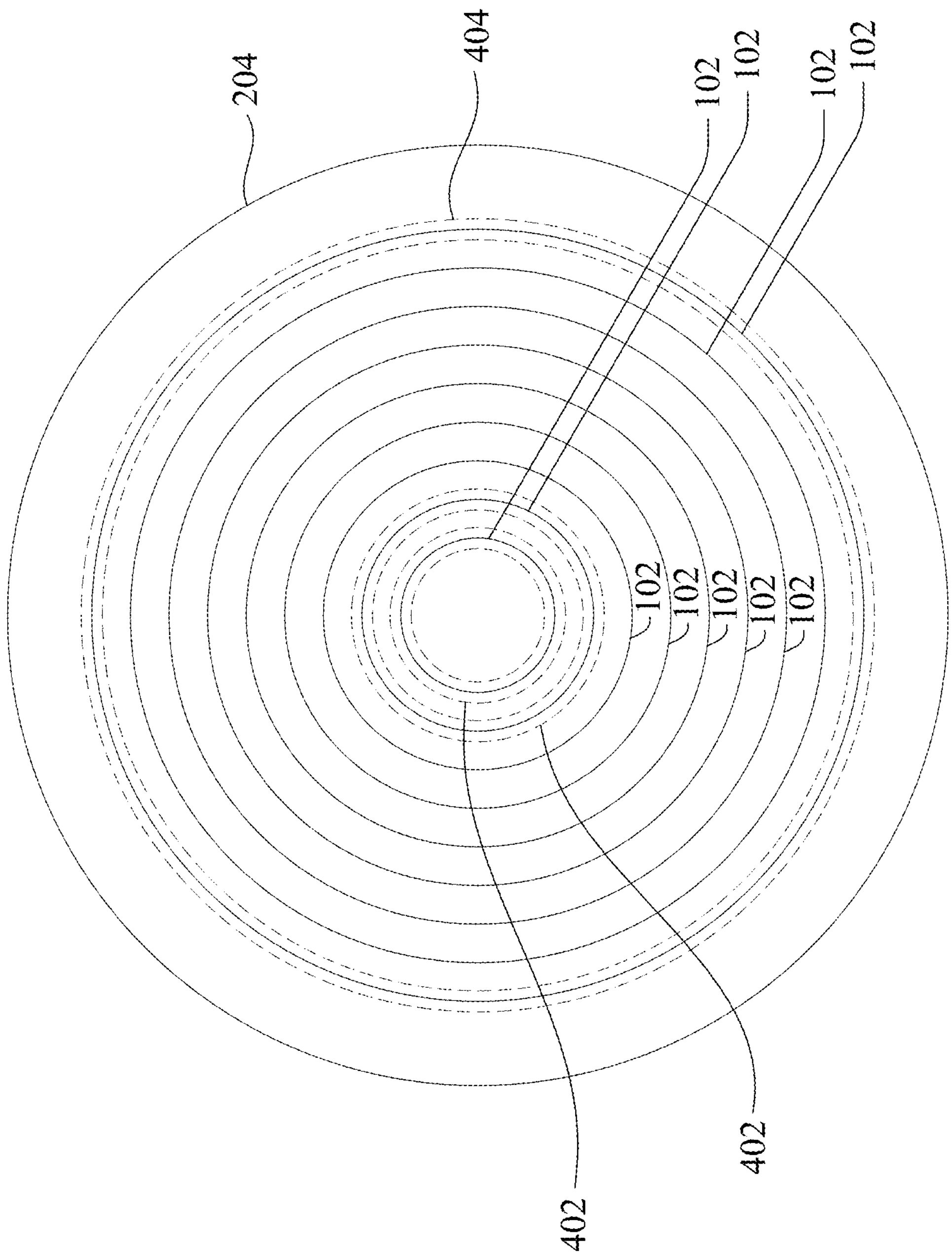
FIG. 3B is a top view of the cooling grooves in the alternate circular formation according to one or more embodiments in the present disclosure.

FIG. 3B shows a top view of the cooling grooves 102 in the alternate circular formation, according to one or more embodiments in the present disclosure.

Figure 4:
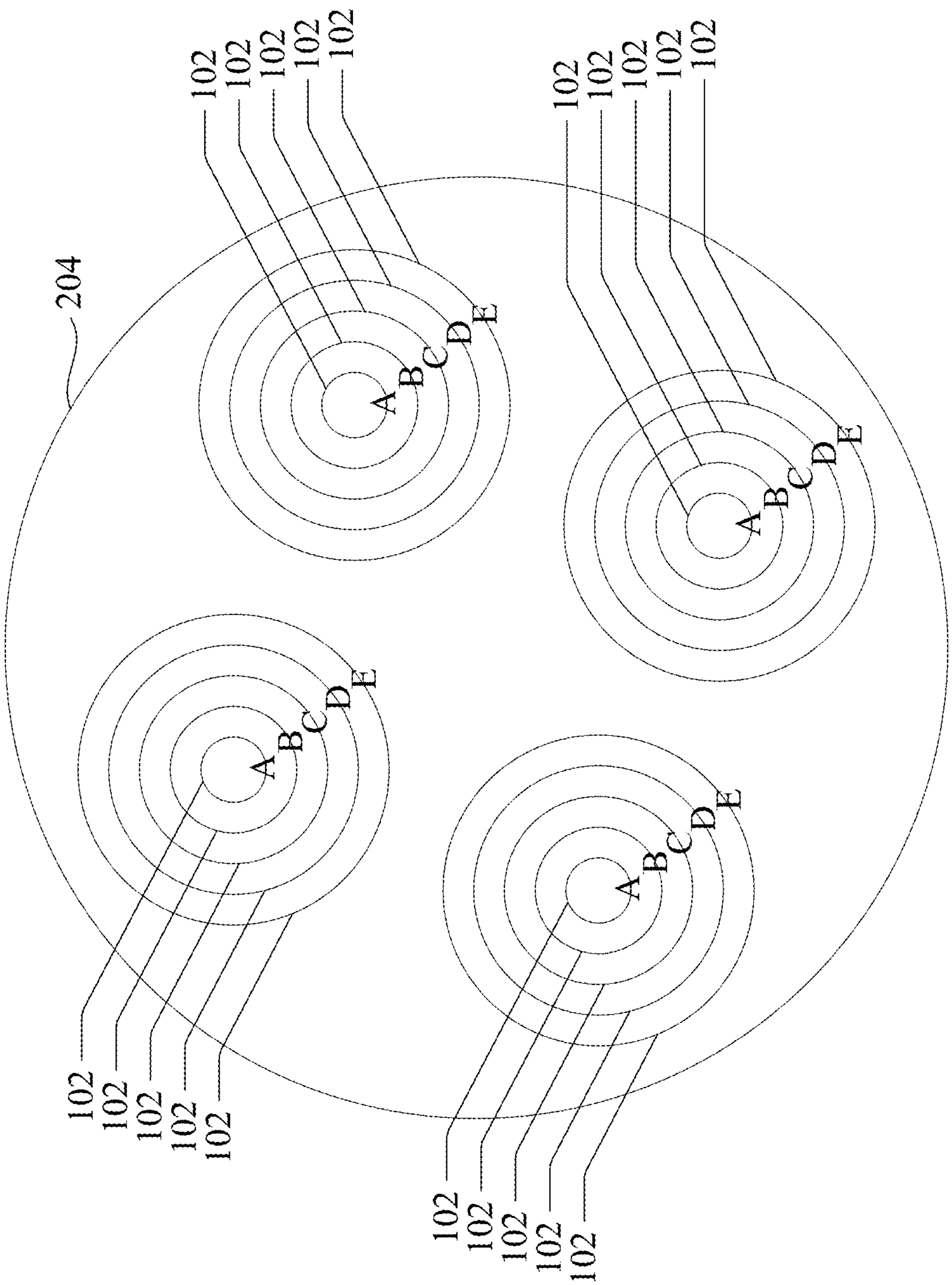
FIG. 4 is a top view of the cooling grooves in a formation corresponding to an orbital pattern of a second magnet according to one or more embodiments in the present disclosure.

FIG. 4 shows a top view of the cooling grooves 102 in a formation corresponding to an orbital pattern of a second magnet 304, according to one or more embodiments in the present disclosure.

Figure 5:
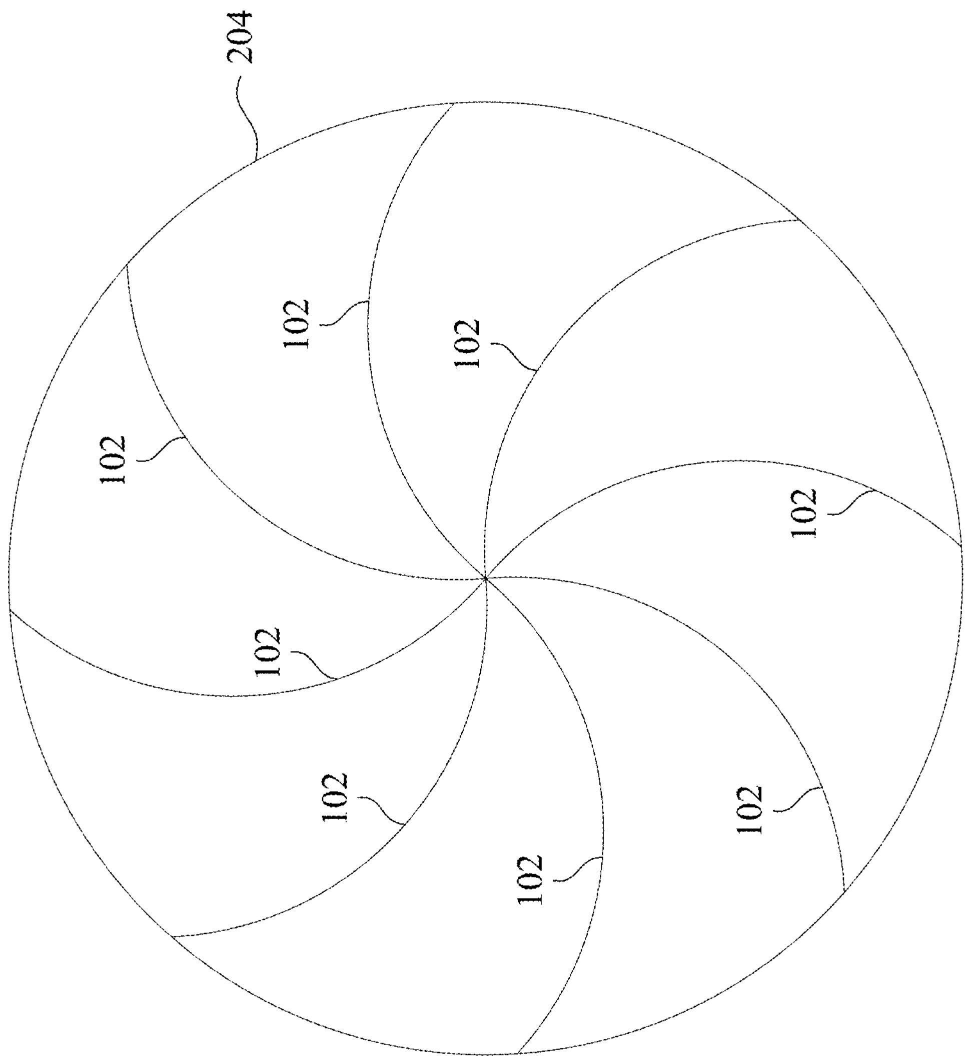
FIG. 5 is a top view of the cooling grooves in an impeller shaped formation according to one or more embodiments in the present disclosure.

FIG. 5 shows a top view of the cooling grooves 102 in an impeller shaped formation, according to one or more embodiments in the present disclosure.

Figure 6:
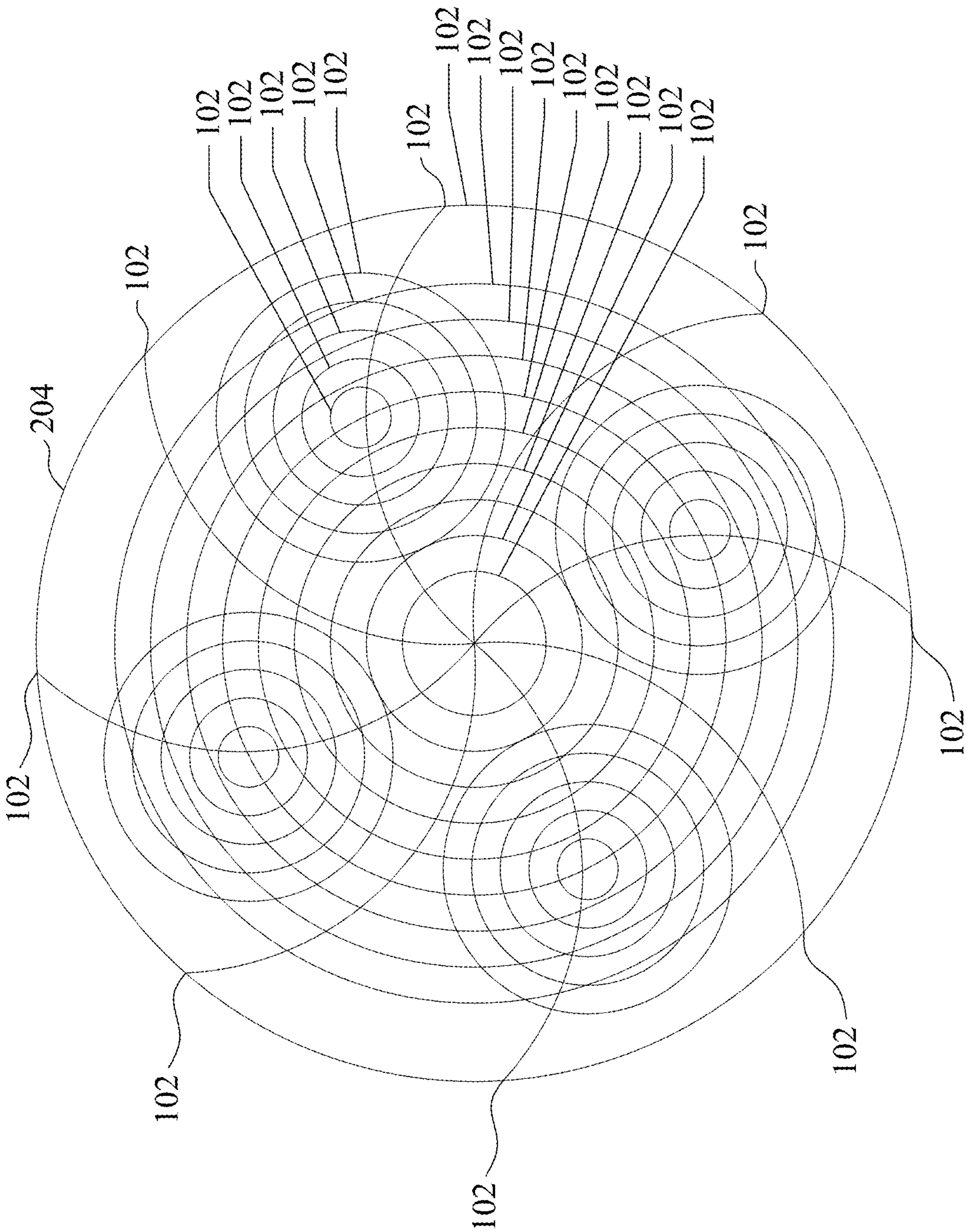
FIG. 6 is a top view of the cooling grooves in multiple formations overlapping to each other according to one or more embodiments in the present disclosure.

FIG. 6 shows a top view of the cooling grooves 102 in multiple formations overlapping to each other, according to one or more embodiments in the present disclosure.

Referring to FIGS. 1 and 2, the substrate process chamber 200 includes a substrate pedestal 202 that supports a substrate 902 (e.g., wafer) in the substrate process chamber 200, a target 204 enclosing the substrate process chamber 200, and a process shield 700 between the target 204 and substrate pedestal 202. As a result of the ion bombardment on the bottom surface of the target 204 and dislodgement of atoms from the target, a thin film 904 (of target material) is deposited on the substrate 902. Smart cooling system 100 for the substrate process chamber 200 includes a first cooling space 400 in the substrate process chamber 200 that is defined by the inner top portion of the substrate process chamber 200 and the top surface of the target 204. First magnet 302 is configured to rotate in the first cooling space 400 to increase deposition performance (e.g., rate of deposition) and uniformity of target erosion. Similarly, the second magnet 304 is configured to orbit the first magnet 302 to increase deposition performance (e.g., rate of deposition) and uniformity of target erosion.

In various embodiments, the smart cooling system 100 includes a pump 106 for circulating the coolant in the first cooling space 400. In some embodiments, the smart cooling system 100 includes more than one pump 106 to circulate the coolant. In some embodiments, one or more first coolant inlets 402 are in fluid communication with the first cooling space 400 and one or more first coolant outlets 404 are in fluid communication with the first cooling space 400, which are used to circulate the coolant in the first cooling space 400.

In various embodiments, the smart cooling system 100 includes a chiller 104 including the pump 106 that circulates the coolant. Chiller 104 removes the heat (e.g., thermal energy from the target 204 and other components such as the first magnet 302 and the second magnet 304) that was absorbed by the coolant as the coolant is being circulated in the first cooling space 400. After the chiller 104 removes the heat from the coolant, the pump 106 supplies the "chilled" coolant back to the first cooling space 400 via the first coolant inlet 402. This coolant circulation cycle continues as the substrate process chamber 200 is operated during a fabrication process.

As shown in FIG. 1, the chiller 104 provides the "chilled" coolant to the first cooling space 400 in the substrate process chamber 200. As discussed above, the first cooling space 400 is defined by the top surface of the target 204 and top inner portion of the substrate process chamber 200. In the first cooling space 400, the first magnet 302 and the second magnet 304 are located to increase the deposition performance (e.g., rate of deposition) and uniformity of target erosion.

Due to the ion bombardment and additional ion bombardment as a result of magnetic field generated from the first magnet 302 and the second magnet 304, the temperature of the target 204 and other components in the substrate process chamber 200 increases. To cool or reduce the temperature of the target 204 and other components before are damaged by the high temperature, the coolant (e.g., (deionized) water, glycol, ethylene glycol, propylene, or any combination therefore) is supplied to the first cooling space 400 via one or more first coolant inlets 402.

As shown in FIG. 1, the substrate process chamber 200 includes two first coolant inlets 402 in a circular or ring shape and one first coolant outlet 404 in the circular or ring shape. Chiller 104 is configured to pump the "chilled" coolant into the first cooling space 400 via the first coolant inlets 402. After the coolant absorbs the heat from the target 204 and other components (e.g., the first magnet 302 and the second magnet 304) in the first cooling space 400, "used" coolant is collected by the chiller 104 via the first coolant outlet 404.

As illustrated in FIG. 1, the first coolant inlets 402 are located on the center area of the first cooling space 400 and the first coolant outlet 404 is located on the periphery area of the first cooling space 400. Due to the arrangement of the first coolant inlets 402 and the first coolant outlet 404 (i.e., location for each first coolant inlets 402 and outlet 404), the coolant flows from the center area of the first cooling space 400 to the periphery area of the first cooling space 400. The flow or circulation pattern of the coolant in the first cooling space 400 increases the efficiency of the cooling. Embodiments in accordance with the present disclosure are not limited to the foregoing arrangement of first coolant inlets 402 and first coolant outlet 404. For example, in other embodiments, the location of the first coolant outlet 404 and the first coolant inlets 402 are reversed. In yet other embodiments, more than two first coolant inlets 402 are utilized or more than one first coolant outlet 404 is utilized. In yet other embodiments, one first coolant inlet 402 is utilized and more than one first coolant outlet 404 is utilized.

Referring to FIGS. 1 and 3A, the smart cooling system 100 includes the target 204 with the cooling grooves 102 in the circular or ring formation according to one or more embodiment of the present disclosure. The circular or ring formation is provided by a plurality of cooling grooves 102 having different diameters and sharing a common center. In other words, cooling grooves 102 are concentric relative to each other.

As shown in FIGS. 1 and 3A, a depth for the cooling grooves 102 increases as the cooling grooves 102 are located further away from the center of the target 204. In some situations (e.g., "chilled" coolant from the chiller 104 flowing or circulating from the center area of the target 204 (i.e., the center area of the first cooling space 400) to the periphery area of the target 204 (i.e., the periphery area of the first cooling space 400)), when the depth of the cooling grooves 102 is less near the center of the target 204, there is less chance for the "used" coolant (i.e., "chilled" coolant that turned into the "used" coolant) to stay in contact with the target 204 longer at the cooling grooves 102 located near the center area of the target 204 than the cooling grooves 102 at the periphery area of the target 204 with their greater depth. The reduced contact time between the "used" coolant and the target 204 near the center of the target compared to the contact time near the periphery of the target means more of the "chilled" coolant, which can absorb an increased amount of thermal energy from the target, is provided to the target near its center compared to near the periphery of the target. This provides more "chilled" coolant circulation on the center area of the target 204, which is normally at a higher temperature than a normal operation temperature of the periphery area of the target 204 during the sputtering process. Accordingly, the coolant from the chiller 104 which is at a relatively low temperature ("chilled" coolant) is supplied to the center area of the target 204 via the first coolant inlets 402. As a result, the overall temperature of the target 204 is reduced while maintaining or improving the temperature uniformity of target 204.

As illustrated in FIG. 1, the first coolant inlets 402 in the circular or ring shape are overlapped with the cooling grooves 102 in the circular or ring formation on the center area of the target 204, and the first coolant outlet 404 is located on the periphery area of the first cooling space 400. This arrangement provides the "chilled" coolant flowing or circulation from the center area of the target 204 to the periphery area of the target 204. Also, the cooling grooves 102 in FIG. 1 provide more surface area between the coolant and the target 204 which allows more heat (e.g., thermal energy) absorbed by the coolant from the target 204.

Referring to FIGS. 2 and 3B, the smart cooling system 100 includes the target 204 with the cooling grooves 102 in the alternate circular or ring formation according to one or more embodiment of the present disclosure.

As shown in FIGS. 2 and 3B, a groove surface area of the cooling grooves 102 decreases as the cooling grooves 102 are located further away from the center area of the target 204. In other words, there is more surface area between the coolant and the center area of the target 204 (which is normally hotter than the periphery area of target 204) than between the coolant and the periphery area of the target 204. Accordingly, it is more likely that the heat from the target 204 is transferred from the center area of the target 204 to the coolant more efficiently than the periphery area of the target 204 to the coolant. As a result, the overall temperature of the target 204 is reduced while maintaining or improving the temperature uniformity of target 204.

As shown in FIG. 2, the depth of the cooling grooves 102 is adjusted to change the groove surface area (e.g., bottom surface of cooling groove, side surfaces of cooling groove). However, in some embodiments of the present disclosure, the width of the cooling groove 102 is adjusted to change the groove surface area (e.g., bottom surface of cooling groove, side surfaces of cooling groove). In some embodiments, the cooling groove 102 is in different shapes (e.g., triangular shape, curved shape, rectangular shape) for the similar reason. In some embodiments, the groove surface area of the cooling groove 102 is adjusted by any combination of adjusting the depth of the cooling grooves 102, the width of the cooling groove 102, and the shape of the cooling grooves 102.

As shown in FIG. 2, the first coolant inlets 402 in the circular or ring shape are overlapped with the cooling grooves 102 in the circular or ring formation on the center area of the target 204—providing more "chilled" coolant to the center of the target 204 than the periphery area of the target 204. Since the center area of the target 204 is normally hotter than the periphery area of the target 204 during the sputtering process, the overlapping arrangement of the first coolant inlets 402 and the cooling grooves 102 on the target 204 provides efficient cooling to the center area of the target 204.

As shown in FIGS. 1, 2, 3A, and 3B, the first coolant inlets 402 and the first coolant outlets 404 can be arranged in the circular or ring shape. However, the present disclosure does not limit the shape (and/or location) of the first coolant inlets 402 and the first coolant outlets 404. Likewise, the present disclosure does not limit the number of the first coolant inlets 402 and the first coolant outlets 404.

Referring to FIG. 3A, the smart cooling system 100 includes two first coolant inlets 402 in the circular or ring shape and one first coolant outlet 404 in the circular or ring for the coolant circulation according to one or more embodiments. As discussed above, the first coolant inlets 402 in the circular or ring shape are overlapped (or aligned) with the cooling grooves in the circular or ring formation on the center area of the target 204 for more efficient cooling. Similarly, the first coolant outlet 404 is overlapped (or aligned) with one of the grooves on the periphery area of the target 204.

In the illustrated embodiment shown in FIG. 3A, the cooling system 100 includes two first coolant inlets 402 in the circular or ring shape and one first coolant outlet 404 in the circular or ring shape. However, as discussed above, the present disclosure does not limit the number of first coolant inlets 402 and outlets 404 used for the coolant circulation. In addition, the present disclosure does not limit the shape of the first coolant inlets 402 and outlets 404. In a non-limiting example, the first coolant inlet 402 can be a circular opening, and the first coolant outlet 404 also can be a circular opening.

Referring to FIG. 3B, the smart cooling system 100 includes two first coolant inlets 402 in the circular or ring shape and one first coolant outlet 404 in the circular or ring for the coolant circulation according to one or more embodiments. As discussed above, the first coolant inlets 402 in the circular or ring shape are overlapped (or aligned) with the cooling grooves in the circular or ring formation on the center area of the target 204 for more efficient cooling. Similarly, the first coolant outlet 404 is overlapped (or aligned) with one of the grooves on the periphery area of the target 204.

As discussed above, the cooling system 100 includes two first coolant inlets 402 in the circular or ring shape and one first coolant outlet 404 in the circular or ring shape. However, the present disclosure does not limit the number of first coolant inlets 402 and outlets 404 overlapped with the cooling grooves 102. In addition, the present disclosure does not limit the shape of the first coolant inlets 402 and the first coolant outlets 404.

As illustrated in the FIGS. 3A and 3B, the circular or ring formation for the cooling grooves 102 on the target 204 corresponds to (e.g., overlaps with) the rotational pattern of the first magnet 302 which is configured to rotate above (or behind) the target 204. The magnetic field from the first magnet 302 increases the ion bombardment where the magnetic field is applied to. Additional ion bombardment created by the first magnet 302 produces more heat that causes thermal stress on the target 204. Additional heat produced by the first magnet 302 increases the temperature on the target 204 in a pattern corresponding (or according) to the rotational pattern. By having the cooling grooves 102 in the circular or ring formation, which overlaps with the rotational pattern of the first magnet 302, the heat applied on the target 204 in the rotational pattern of the first magnet 302 can be released or cooled efficiently. As illustrated in FIGS. 3A and 3B, the cooling grooves 102 overlapping with the rotational pattern provides more surface area between the target 204 and the coolant. As a result, the overall temperature of the target 204 is reduced while maintaining or improving the temperature uniformity of target 204.

However, the present disclosure does not limit the cooling grooves 102 to be in the circular or ring formation only. As a non-limiting example, the cooling grooves 102 can be in an impeller shaped formation (shown later in FIG. 5) or non-circular formations that are suitable for cooling the target 204.

Referring to FIG. 4, the smart cooling system 100 includes four groups of the cooling grooves 102 on the target 204 according to one or more embodiments of the present disclosure. Cooling groves 102 in each of the groups are in the circular or ring formation which is based on (e.g., overlapped with or corresponding to) the orbital pattern of the second magnet 304 (which orbits around the first magnet 302). Each of the cooling grooves 102 shown in the FIG. 4 have the same depth (i.e., same depth for all of the cooling grooves). However, the present disclosure does not limit that the depth to be the same for all of the cooling grooves 102 in the circular or ring formation which is based on the orbital pattern of the second magnet 304.

In some embodiments, the cooling grooves 102 in FIG. 4 are arranged such that the depth of cooling groove A, cooling groove B, cooling groove C, cooling groove D, and cooling groove E have a following relationship similar to the cooling grooves 102 in FIG. 1: cooling groove A<cooling groove B<cooling groove C<cooling groove D<cooling groove E.

In some embodiments, the cooling grooves 102 in FIG. 4 are arranged such that the groove surface area of cooling groove A, cooling groove B, cooling groove C, cooling groove D, and cooling groove E have a following relationship similar to the cooling grooves in FIG. 2: cooling groove A>cooling groove B>cooling groove C>cooling groove D>cooling groove E.

As shown in FIG. 4, the smart cooling system 100 for the substrate process chamber 200 includes four groups of the cooling grooves 102. However, the present disclosure does not limit the number of the groups of the cooling grooves 102. In some embodiments, more than four groups of the cooling grooves 102 are arranged on the target 204. In some embodiments, less than four groups of the cooling grooves 102 are arranged on the target 204. In some embodiments, at least some of the groups of the cooling grooves 102 are overlapped (or at least partially overlapped) with each other based on the orbital pattern of the second magnet 304.

Additional ion bombardment created by the second magnet 304 produces more heat that causes thermal stress on the target 204. Additional heat produced by the second magnet 304 increases the temperature on the target 204 in a pattern corresponding (or according) to the orbital pattern. By having the cooling grooves 102 in the circular or ring formation, which overlaps with the orbital pattern of the second magnet 304, the heat applied on the target 204 in the orbital pattern of the second magnet 304 can be released or cooled efficiently. As shown in FIG. 4, the cooling grooves 102 overlapping with the orbital pattern provides more surface area between the target 204 and the coolant. As a result, the overall temperature of the target 204 is reduced while maintaining or improving the temperature uniformity of target 204.

Referring to FIG. 5, the smart cooling system 100 includes the cooling grooves 102 in the impeller shaped formation on the target 204 according to one or more embodiments of the present disclosure. Cooling grooves 102 in the impeller shaped formation on the target 204 provide the cooling grooves 102 on the target 204 in different densities. As illustrated in FIG. 5, the density of the cooling grooves 102 near the center of the target 204 is higher than the density of the cooling grooves 102 at the periphery area of the target 204. This arrangement provides efficient cooling to the center area of the target 204 which is normally hotter than the periphery area of the target 204 during the sputtering process. As a result, the overall temperature of the target 204 is reduced while maintaining or improving the temperature uniformity of target 204.

Referring to FIG. 6, the smart cooling system 100 includes the cooling grooves 102 in multiple formations according to one or more embodiments of the present disclosure.

As shown in FIG. 6, the cooling grooves 102 are arranged in three different formations on the target 204 including the circular formation based on the rotational pattern of the first magnet 302, the alternate circular formation based on the orbital pattern of the second magnet 304, and the impeller shaped formation. Accordingly, three different formation are used for the cooling grooves 102 as shown in FIG. 6. However, the present disclosure does not limit the number of formations used for the arrangement of the cooling grooves 102 on the target 204. As a non-limiting example, two different formations can be used for the arrangement of the cooling grooves 102 on the target 204. As an alternative non-limiting example, more than three different formations can be used for the arrangement of the cooing grooves 102 on the target 204.

Figure 7:
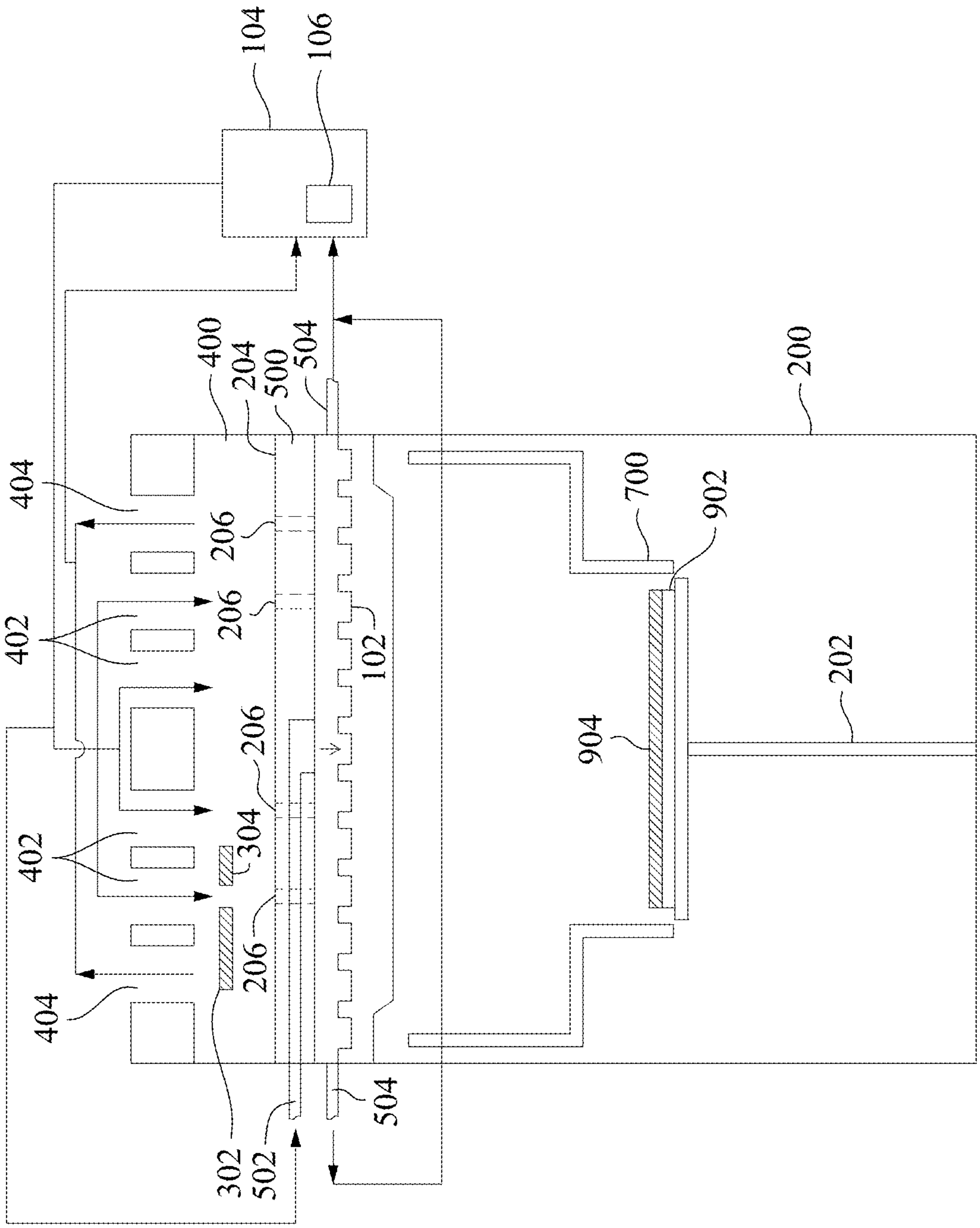
FIG. 7 is a sectional view of a substrate process chamber with the first cooling space and a second cooling space according to one or more embodiments in the present disclosure.

FIG. 7 is a sectional view of a substrate process chamber 200 with the first cooling space 400 and a second cooling space 500 according to one or more embodiments in the present disclosure.

Referring to FIG. 7, the substrate process chamber 200 includes a substrate pedestal 202 that supports a substrate 902 (e.g., wafer) in the substrate process chamber 200, a target 204 enclosing the substrate process chamber 200, a process shield 700 between the target 204 and substrate pedestal 202. Smart cooling system 100 for the substrate process chamber 200 includes the first cooling space 400 in the substrate process chamber 200 that is defined by the inner top portion of the substrate process chamber 200 and the top surface of the target 204. Smart cooling system 100 also includes the second cooling space 500 within the target 204.

In the illustrated embodiment shown in FIG. 7, the smart cooling system for substrate process chamber 200 includes more than one cooling space for an enhanced coolant circulation (e.g., the first cooling space 400 and the second cooling space 500). As shown in FIG. 7, the second cooling space 500 is defined by an internal surface of the target 204 (including cooling grooves 102 arranged on the internal surface of the target 204) and the top portion of the target 204 (e.g., second cooling space 500 defined by a cavity space or hollow space within the target 204).

To avoid unnecessary repeating, details on the first cooling space 400, the first coolant inlets 402, the first coolant outlet 403, and the cooling grooves 102 on the target 204 are not reiterated here.

As shown in FIG. 7, to decrease the temperature of the target 204 in an efficient manner, the second cooling space 500 is provided within the target 204. Moreover, additional inlets (i.e., second cooling inlets 502) and additional outlets (i.e., second cooling outlets 504) are provided to the second cooling space 500 so that the target 204 is cooled by the coolant circulating in the first cooling space 400 and in the second cooling space 500. In addition, the first magnet 302 and the second magnet 304 are cooled by the coolant circulating in the first cooling space 400 and in the second cooling space 500.

As shown in FIG. 7, the cooling grooves 102 in the circular or ring formation are arranged on the internal surface of the target 204. Each of the cooling grooves 102 arranged on the internal surface of the target 204 have the same depth (i.e., same depth for all of the cooling grooves 102). As discussed above, the cooling grooves 102 provide more surface area between the internal surface of the target 204 and the coolant in the second cooling space 500. However, the present disclosure does not limit the depth to be the same for all of the cooling grooves 102 arranged on the internal surface of the target 204. In some embodiments, the depth (and/or width) for the cooling grooves 102 arranged on the internal surface of the target 204 increases as the cooling grooves 102 are located further away from the center of the target 204. In some embodiments, the depth (and/or width) for the cooling grooves 102 on the internal surface of the target 204 decreases as the cooling grooves 102 are located further away from the center of the target 204.

As illustrated in FIG. 7, one second coolant inlet 502 is in the top portion of the target 204 and used to supply the coolant into the second cooling space 500, and two second coolant outlets 504 are connected to the periphery area of the target 204 (e.g., side surface of the target 204 and/or periphery area of the target surface) to collect the coolant back to the chiller 104 for the coolant circulation. Based on the locations of the second cooling inlets 502 and the second cooling outlet 504 connected to the second cooling space 500, the coolant supplied to the second cooling space 500 efficiently cools the target 204 by circulating from the center area of the target 204 to the periphery area of the target 204.

In the illustrated embodiment in FIG. 7, one second coolant inlet 502 and two coolant outlets 504 are connected to the second cooling space 500. However, the present disclosure does not limit the number of the second coolant inlets 502 and the second coolant outlets 504. In some embodiments, multiple second coolant inlets 502 and/or multiple second coolant outlets 504 are connected to the second cooling space 500 for the coolant circulation. In some embodiments, the second coolant inlet 502 and the second coolant outlet 504 are located at other suitable locations.

As shown in FIG. 7, in addition to the coolant being circulated in the first cooling space 400 that directly cools the temperature of the magnets (e.g., the first magnet 302 and the second magnet 304) and the target 204, the coolant circulated in the second cooling space 500 provides direct cooling to the target 204 and indirect cooling to the magnets (e.g., the first magnet 302 and the second magnet 304).

As illustrated in FIG. 7, the smart cooling system 100 for the substrate process chamber 200 includes four openings 206 that allow the coolant from the first cooling space 400 flowing to the second cooling space 500. The same openings 206 can be used to allow the coolant from the second cooling space 500 to the first cooling space 400. As shown in FIG. 7, the openings 206 are positioned between the first cooling space 400 and the second cooling space 500. In some embodiments, more than four openings 206 are arranged between the first cooling space 400 and the second cooling space 500. In some embodiments, less than four openings 206 are arranged between the first cooling space 400 and the second cooling space 500. In some embodiments, the openings 206 are used to release relatively hot coolant (the "used" coolant) from the second cooling space 500 to the first cooling space 400.

In some embodiments of the present disclosure, the internal surface of the target 204 includes one or more cooling grooves 102 similar to the cooling grooves 102 on the target 204 discussed above to control or enhance the coolant circulation within the second cooling space 500 as well as to improve the temperature uniformity of target 204.

Accordingly, as discussed above, the present disclosure does not limit that all of the cooling grooves 102 arranged on the internal surface of the target 204 have the same depth. In some embodiments, similar to the circular grooves 102 shown in FIG. 1, the depth for the cooling grooves 102 on the internal surface of the target 204 change based on the position of the cooling grooves 102 from the center of the target 204.

In some embodiments, as discussed above, the depth (and/or width) of the cooling grooves 102 in the circular or ring formation on the internal surface of the target 204 increases as the distance between the center of the target 204 and the cooling grooves increases.

In some embodiments, the depth (and/or width) of the cooling grooves 102 in the circular or ring formation on the internal surface of the target 204 decreases as the distance between the center of the target 204 and the cooling grooves increases.

In some embodiments, similar to the cooling grooves 102 in the circular or ring formation created based on the orbital pattern of the second magnet 304 in FIG. 4, one or more groups of the cooling grooves 102 created based on the orbital pattern of the second magnet 304 are corresponding to the second cooling space 500. As discussed in FIG. 4, the depth for the cooling grooves 102 can be configured in different manners.

In some embodiments, the cooling grooves 102 on the internal surface of the target 204 are arranged similar to the cooling grooves 102 in the impeller shaped formation shown in FIG. 5.

In some embodiments, similar to cooling grooves 102 in the multiple formations that are overlapped as shown in FIG. 6, the cooling grooves 102 on the internal surface of the target 204 are based on two or more formations.

Figure 8:
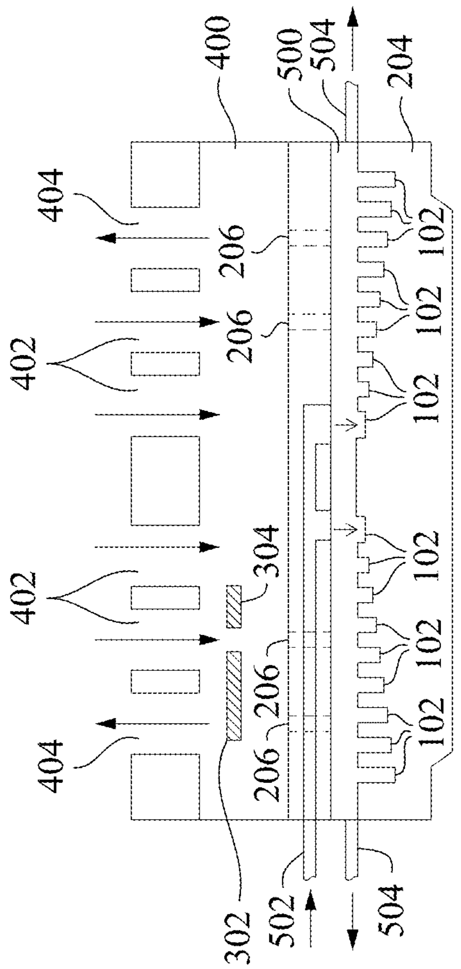
FIG. 8 is a sectional view of a substrate process chamber with the first cooling space and a second cooling space according to one or more embodiments in the present disclosure.

FIG. 8 is a sectional view of a substrate process chamber 200 with the first cooling space 400 and a second cooling space 500 according to one or more embodiments in the present disclosure.

As discussed above, the present disclosure does not limit that all of the cooling grooves 102 in the circular or ring formation arranged on the internal surface of the target 204 have the same depth. In some embodiments, similar to the cooling grooves 102 in the circular or ring formation shown in FIG. 1, the depth for the cooling grooves 102 changes based on the position of the cooling grooves 102 from the center of the target 204.

As shown in FIG. 8, the depth for the cooling grooves 102 in the circular or ring formation on the internal surface of the target 204 increases as the cooling grooves 102 are located further away from the center of the target 204. As discussed above with respect to FIGS. 1 and 3A, in some situations, there is less chance for the "used" coolant to stay longer at the cooling grooves 102 located on the center area of the target 204 than the cooling grooves 102 at the periphery area of the target 204. This accelerates the coolant circulation with "chilled" coolant at the center area of the target 204. Accordingly, the coolant from the chiller 104 which is at a relatively low temperature ("chilled" coolant) is supplied to the center area of the target 204 via the second coolant inlet 502. In addition, the second coolant inlet 502 in the circular or ring shape is overlapped with the cooling grooves 102 in the circular or ring formation at the center areas of the internal surface of the target 204—providing more "chilled" coolant to the center of the target 204 than the periphery area of the target 204. Since the center area of the target 204 is normally hotter than the periphery area of the target 204 during the sputtering process, the overlapping arrangement of the second coolant inlets 502 and the cooling grooves 102 on the internal surface of the target 204 along with the coolant flow pattern in the second cooling space 500 provides more cooling to the center area of the target 204. As a result, the overall temperature of the target 204 is reduced while maintaining or improving the temperature uniformity of target 204.

As shown in FIG. 8, the second coolant inlet 502 is connected to the center area of the second cooling space 500, and the second outlets 504 are connected to the periphery area of the target 204 (e.g., side surface of the target 204 and/or periphery area of the target surface) to collect the coolant back to the chiller. Based on the positions of the second coolant inlet 502 and the second coolant outlet 504, the coolant supplied to the second cooling space 500 efficiently cools the target 204 by circulating from the center area of the target 204 to the periphery area of the target 204.

In some embodiments, the shape (or formation) of the second coolant inlets 502 is arranged similar to the first coolant inlets 402. In some embodiments, the shape (or formation) of the second coolant outlet 504 is arranged similar to the first coolant outlets 404.

In addition to the coolant circulated in the first cooling space 400 that directly cools down the temperature of the magnets (e.g., the first magnet 302 and the second magnet 304) and the target 204, the coolant circulated in the second cooling space 500 provides direct cooling to the target 204 and indirect cooling to the magnets (e.g., the first magnet 302 and the second magnet 304).

As illustrated in FIG. 8, the smart cooling system 100 for the substrate process chamber 200 includes four openings 206 that allow the coolant from the first cooling space 400 to flow to the second cooling space 500. The same openings 206 can be used to allow the coolant from the second cooling space 500 to flow to the first cooling space 400. As shown in FIG. 8, the openings 206 are positioned between the first cooling space 400 and the second cooling space 500. In some embodiments, the openings 206 are used to release relatively hot coolant ("used" coolant) from the second cooling space 500 to the first cooling space 400.

Figure 9:
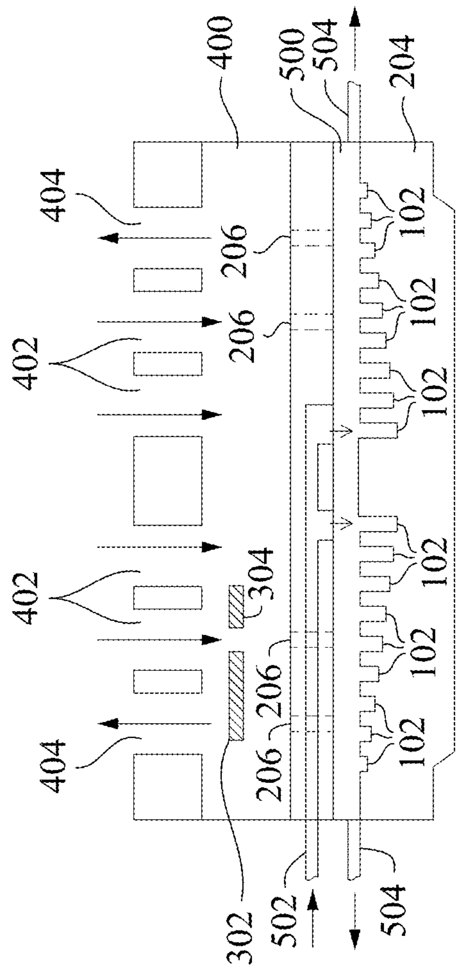
FIG. 9 is a sectional view of a substrate process chamber with the first cooling space and a second cooling space according to one or more embodiments in the present disclosure.

FIG. 9 is a sectional view of a substrate process chamber 200 with the first cooling space 400 and a second cooling space 500 according to one or more embodiments in the present disclosure.

As shown in FIG. 9, the groove surface for the cooling grooves 102 on the internal surface of the target 204 decreases as the cooling grooves 102 are located further away from the center of the target 204. In other words, there is more surface area between the coolant and the center area of the internal surface of the target 204. Accordingly, it is more likely that the heat from the target 204 is transferred from the center area of the target 204 to the coolant efficiently than the periphery area of the target 204 to the coolant.

In addition, the second coolant inlet 502 in the circular or ring shape are overlapped with the cooling grooves 102 in the circular or ring formation at the center areas of internal surface of the target 204—providing more "chilled" coolant to the center of the target 204 than the periphery area of the target 204. Since the center area of the target 204 is normally hotter than the periphery area of the target 204 during the sputtering process, the overlapping arrangement of the second coolant inlets 502 and the cooling grooves 102 on the internal surface of the target 204 along with the coolant flow pattern in the second cooling space 500 provides more cooling to the center area of the target 204. As a result, the overall temperature of the target 204 is reduced while maintaining or improving the temperature uniformity of target 204.

As shown in FIG. 9, the second coolant inlet 502 is connected to the center area of the second cooling space 500, and the second outlets 504 are connected to the periphery area of the target 204 (e.g., side surface of the target 204 and/or periphery area of the target surface) to collect the coolant back to the chiller. Based on the positions of the second coolant inlet 502 and the second coolant outlet 504, the coolant supplied to the second cooling space 500 efficiently cools the target 204 by circulating from the center area of the target 204 to the periphery area of the target 204.

In addition to the coolant circulated in the first cooling space 400 that directly cools the temperature of the magnets (e.g., the first magnet 302 and the second magnet 304) and the target 204, the coolant circulated in the second cooling space 500 provides direct cooling to the target 204 and indirect cooling to the magnets (e.g., the first magnet 302 and the second magnet 304).

As illustrated in FIG. 9, the smart cooling system 100 for the substrate process chamber 200 includes four openings 206 that allow the coolant from the first cooling space 400 to flow to the second cooling space 500. The same openings 206 can be used to allow the coolant to flow from the second cooling space 500 to the first cooling space 400. As shown in FIG. 9, the openings 206 are positioned between the first cooling space 400 and the second cooling space 500. In some embodiments, the openings 206 are used to release relatively hot coolant ("used" coolant) from the second cooling space 500 to the first cooling space 400.

Figure 10:
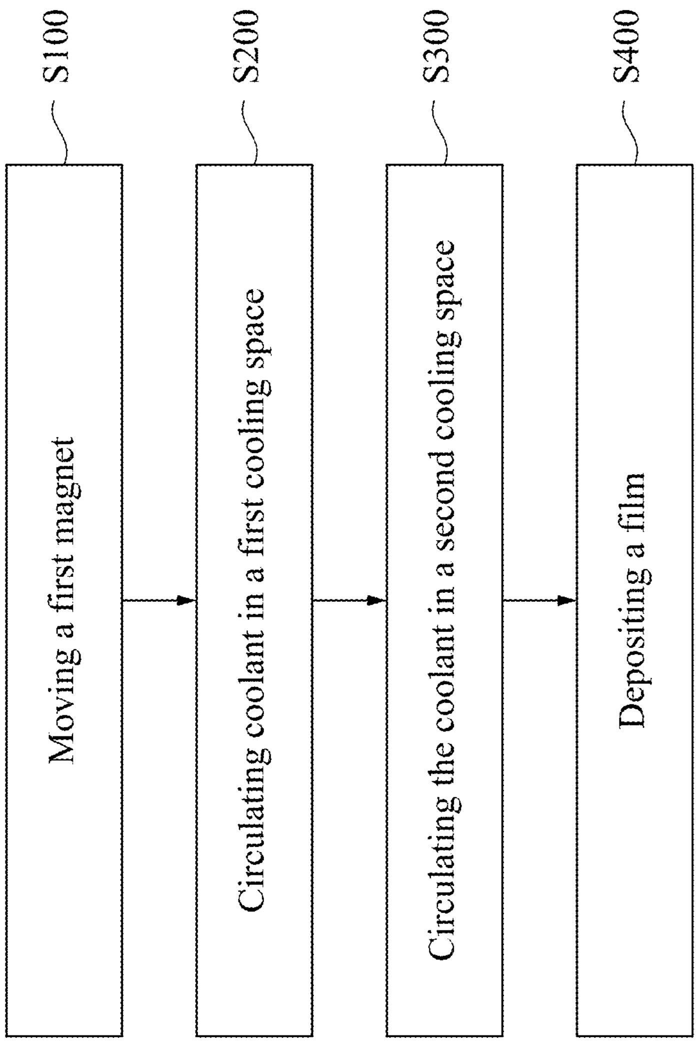
FIG. 10 is a flow chart illustrating a method of depositing a material from the target onto the substrate in a substrate process chamber according to one or more embodiments of the present disclosure.

FIG. 10 is a flow chart illustrating a method of depositing a material from the target 204 onto the substrate 902 in a substrate process chamber 200 according to one or more embodiments of the present disclosure.

Referring to FIG. 10, the method of depositing the material form the target 204 onto the substrate 902 includes: step S100 of running the first magnet 302 within the first cooling space 400; step S200 of circulating coolant in the first cooling space 400; step S300 of circulating the coolant in the second cooing space 500 disposed within the target 204; and step S400 of depositing a film of the material on the substrate 902.

Step S100 of moving the first magnet 302 within the first cooling space 400 includes a step of rotating the first magnet 302 which is configured to rotate in the first cooling space 400 to increase deposition performance (e.g., rate for deposition) and uniformity of target erosion. In addition, the second magnet 304 is configured to orbit the first magnet 302 to increase deposition performance (e.g., rate for deposition) and uniformity of target erosion.

Step S200 of circulating coolant in the first cooling space 400 includes supplying the coolant into the first cooling space 400 via the first coolant inlet 402 and collecting the coolant out of the first cooling space 400 via the first coolant outlet 404. As discussed above, the chiller 104 including the pump 106 is used to circulate the coolant.

Step S300 of circulating the coolant in the second cooing space 500 disposed within the target 204 includes supplying the coolant into the second cooling space 500 via the second coolant inlet 502 and collecting the coolant out of the second cooling space 500 via the second coolant outlet 504. As discussed above, the chiller 104 including the pump 106 is used to circulate the coolant.

Step S400 of depositing a film of the material on the substrate 902 includes a step of depositing the thin film 904 on the substrate 902 (e.g., using a suitable sputtering deposition process).

Utilizing the cooling grooves will maintain the temperature of the target and other components within the predetermined temperature range. In addition, the cooling grooves in different formations can be used to cool the portion of the target (e.g., center portion of the target and/or portion of the target overlapping with the rotational pattern of the first magnet 302 and the orbital pattern of the second magnet 304) more efficiently than other portion of the target (e.g., periphery portion of the target) so that the temperature of the target is uniform. Accordingly, the target and other components (e.g., first magnet and second magnet) are less likely to be deformed from thermal stress caused by the heat from the sputtering process and more likely to provide uniform deposition results (e.g., uniform deposition on the substrate).

In other words, the smart cooling system is able to extend the lifetime of the target by preventing the target from being deformed by the thermal stress from the sputtering process by maintaining the target within the predetermined temperature range. In various embodiments, the smart cooling system is able to extend the chamber running time by preventing the target and other components from deforming due to thermal stress from the sputtering process by maintaining the temperature within the predetermined temperature range.

According to one or more embodiments of the present disclosure, a deposition system includes a substrate process chamber, a target within the substrate process chamber, and a plurality of grooves formed on the target in a circular formation. The plurality of first grooves includes a first groove on a center portion of the target and a first groove on a periphery portion of the target, wherein a depth of the first groove on the center portion of the target and a depth of the first groove on the periphery portion of the target are different.

According to one or more embodiments of the present disclosure, a deposition system includes a substrate process chamber, a target within the substrate process chamber. The deposition system includes a first cooling space, for coolant circulation, disposed on the target and a second cooling space, for the coolant circulation, disposed within the target.

According to one or more embodiments of present disclosure, a method of depositing a material from a target onto a substrate in a substrate process chamber includes depositing a film of the material on the substrate. The thin film is deposited on the substrate using any suitable sputtering methods. The method includes moving a first magnet within a first cooling space. The method further includes circulating coolant in the first cooling space and circulating the coolant in a second cooing space disposed within the target.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A target, comprising:

a center area including a center;

a periphery area extends around the center area;

an edge spaced apart from the center area, the edge extends around the periphery area and the center area;

a first surface and a second surface opposite to the first surface;

a plurality of curved grooves that extend into the first surface of the target, each respective curved groove of the plurality of curved grooves terminates before reaching the second surface, the plurality of curved grooves are curved and extend from the center to the edge by extending across the center area and the periphery area, and each respective curved groove of the plurality of curved grooves converges with other respective curved grooves of the plurality of curved grooves at the center, the plurality of curved grooves are configured to, in operation, overlap an orbital pattern of at least one magnet when depositing a material onto a semiconductor substrate present within a substrate process chamber;

a plurality of first circular grooves that intersect the plurality of curved grooves, the plurality of first circular grooves include:

a first group of the plurality of first circular grooves that are concentric with each other; and a second group of the plurality of first circular grooves that are concentric with each other and are spaced apart from the first group of the plurality of first circular grooves;

a plurality of second circular grooves that intersect the plurality of curved grooves, the first group of the plurality of first circular grooves, and the second group of the plurality of first circular grooves.

2. The target of claim 1, wherein the plurality of curved grooves are in an impeller shaped formation.

3. The target of claim 1, wherein a first density of the plurality of curved grooves within the center area is greater than a second density of the plurality of curved grooves within the periphery area.

4. The target of claim 1, wherein the plurality of second circular grooves are concentric about the center of the center area.

5. The target of claim 4, wherein the edge is concentric about the center of the center area.

6. A target, comprising:

a center area including a center;

a periphery area extends around the center area;

an edge spaced apart from the center area, the edge extends around the periphery area and the center area;

a first surface and a second surface opposite to the first surface; and a plurality of first circular grooves that extend into the first surface of the target, wherein each respective first circular groove of the plurality of first circular grooves is concentric with each other;

a plurality of second circular grooves that extend into the first surface of the target, wherein each respective second circular groove of the plurality of second circular grooves is concentric with each other and is eccentric relative to the respective first circular grooves of the plurality of first circular grooves, and wherein:

the plurality of first circular grooves is configured to, in operation, overlap at least one respective orbital pattern of at least one of a first magnet or a second magnet when depositing a material onto a semiconductor substrate present within a semiconductor substrate process chamber, and the plurality of second circular grooves is configured to, in operation, overlap at least one respective orbital pattern of at least one of the first magnet or the second magnet when depositing the material onto the semiconductor substrate present within the semiconductor substrate process chamber.

7. The target of claim 6, wherein the plurality of first circular grooves are concentric about the center of the center area.

8. The target of claim 7, wherein the edge is concentric about the center of the center area.

9. The target of claim 8, wherein the plurality of second circular grooves are concentric about a point offset from the center of the center area.

10. The target of claim 9, wherein at least one of the plurality of first grooves intersects at least one of the plurality of second grooves.

11. The target of claim 6, wherein:

the plurality of first circular grooves are concentric about a first point offset from the center of the center area; and the plurality of second grooves are concentric about a second point offset from the center of the center area.

12. The target of claim 11, further comprising a plurality of third circular grooves that are concentric about the center of the center area, and at least one of the plurality of third circular grooves intersect at least one of the plurality of first circular grooves and intersect at least one of the plurality second circular grooves.

13. A method, comprising:

depositing a material from a target onto a semiconductor substrate in a semiconductor substrate process chamber, the depositing including:

moving a first magnet within a cooling space;

circulating coolant in the cooling space to expose a top surface of the target to the coolant circulated through the cooling space, the top surface delimits the cooling space and includes:

a plurality of curved grooves that are exposed to the coolant circulated through the cooling space;

a plurality of first circular grooves that extend into the first surface of the target, wherein each respective first circular groove of the plurality of first circular grooves is concentric with each other; and a plurality of second circular grooves that extend into the first surface of the target, wherein each respective second circular groove of the plurality of second circular grooves is concentric with each other and is eccentric relative to the respective first circular grooves of the plurality of first circular grooves;

depositing a film of the material on the semiconductor substrate.

14. The method of claim 13, wherein moving the first magnet within the cooling space includes rotating the magnet within the cooling space.

15. The method of claim 14, further comprising moving a second magnet within the cooling space.

16. The method of claim 15, wherein moving the second magnet within the cooling space includes rotating the second magnet around the first magnet.

17. The method of claim 16, wherein the plurality of first circular grooves is configured to, in operation, overlap at least one respective orbital pattern of at least one of the first magnet or the second magnet when depositing a material onto the semiconductor substrate present within the semiconductor substrate process chamber, and the plurality of second circular grooves is configured to, in operation, overlap at least one respective orbital pattern of at least one of the first magnet or the second magnet when depositing the material onto the semiconductor substrate present within the semiconductor substrate process chamber.

18. The method of claim 13, wherein the plurality of curved grooves have an impeller shaped formation.

19. The method of claim 1, wherein respective outermost first circular grooves of the first group and the second group have a first diameter and a respective outermost second circular groove of the plurality of second circular grooves has a second diameter greater than the first diameter.

20. The target of claim 2, wherein a first density of the plurality of curved grooves within the center area is greater than a second density of the plurality of curved grooves within the periphery area.

* * * * *